| (12) | United States Patent | (10) Patent No.: | US 10,395,971 B2 |
|---|---|---|---|
| | Ko et al. | (45) Date of Patent: | Aug. 27, 2019 |

(54) DAM LAMINATE ISOLATION SUBSTRATE

(71) Applicant: TEXAS INSTRUMENTS INCORPORATED, Dallas, TX (US)

(72) Inventors: Chang-Yen Ko, New Taipei (TW); Chung-Ming Cheng, New Taipei (TW); Megan Chang, New Taipei (TW); Chih-Chien Ho, New Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/852,532

(22) Filed: Dec. 22, 2017

(65) Prior Publication Data

US 2019/0198383 A1 Jun. 27, 2019

(51) Int. Cl.

| H01L 23/02 | (2006.01) |
| H01L 21/762 | (2006.01) |
| H01L 23/00 | (2006.01) |
| H01L 21/306 | (2006.01) |
| H05K 3/38 | (2006.01) |

(52) U.S. Cl.

CPC ...... *H01L 21/76229* (2013.01); *H01L 21/306* (2013.01); *H01L 24/32* (2013.01); *H01L 24/48* (2013.01); *H01L 24/49* (2013.01); *H01L 24/73* (2013.01); *H01L 24/83* (2013.01); *H05K 3/38* (2013.01)

(58) Field of Classification Search

CPC ......... H01L 24/32; H01L 24/48; H01L 24/49; H01L 24/73; H01L 24/83; H01L 21/76229

USPC ......................................................... 257/679

See application file for complete search history.

(56) References Cited

U.S. PATENT DOCUMENTS

| 5,409,863 | A | 4/1995 | Newman |
| 6,448,507 | B1 | 9/2002 | Fontecha et al. |
| 6,927,096 | B2 * | 8/2005 | Shimanuki .......... H01L 21/4832 |
| | | | 257/E23.043 |
| 2014/0268780 | A1 * | 9/2014 | Wang .................... F21V 19/003 |
| | | | 362/249.06 |

OTHER PUBLICATIONS

Technical Data Sheet, PSR 800 AUS410, Tauyo Ink MFG, Feb. 2016 pp. 1-4.*

* cited by examiner

*Primary Examiner* — David S Blum

(74) *Attorney, Agent, or Firm* — Dawn Jos; Charles A. Brill; Frank D. Cimino

(57) ABSTRACT

An apparatus includes a lead frame, a dam and adhesive on portions of the lead frame, and an integrated circuit die having a portion on the dam and another portion on the adhesive. The lead frame can include two portions, or two lead frames. The dam can bridge a space between the two lead frames. The dam can be smaller than the integrated circuit die in at least a width dimension of the dam relative to a width dimension of the integrated circuit die, providing that the integrated circuit die overhangs the dam on each side of the width dimension of the dam. Adhesive is located between the integrated circuit die and each lead frame, adjacent to and on each side of the dam. The dam prevents adhesive from spreading into the space between the lead frames.

18 Claims, 6 Drawing Sheets

DAM LAMINATE ISOLATION SUBSTRATE

BACKGROUND

Semiconductor packages often comprise a semiconductor die attached to a lead frame and electrically connected to bond fingers of the lead frame. The semiconductor the is attached to the lead frame by an adhesive resin. Adhesive resins for attaching the semiconductor die to the lead frame include epoxy-based adhesives, acrylate-based adhesives, silicones and polyimides.

Although such adhesives are fairly viscous, they exhibit a tendency to bleed or spread into a space between lead frames of the substrate, possibly causing bridging and/or arcing. This spreading or bleeding of adhesive resin into the space between lead frames of the substrate encroaches upon the HV-LV split DAP spacing and effects proper clearances of M4/5/6 trace-DAP.

There exists a continuing need for a reliable and simple basis for solving the adhesive resin bleed problem that causes damage to, short circuiting of, or poor isolation performance of, the semiconductor package.

SUMMARY

In one aspect, an apparatus includes a lead frame, a dam and adhesive on portions of the lead frame, and an integrated circuit die having a portion on the dam and another portion on the adhesive. The lead frame can include two portions, or two lead frames. The dam bridges a space between the two lead frames. The dam can be smaller than the integrated circuit die in at least a width dimension of the dam relative to a width dimension of the integrated circuit die, providing that the integrated circuit die overhangs the dam on each side of the width dimension of the dam. Adhesive is located between the integrated circuit die and each lead frame, adjacent to and on each side of the dam. The dam prevents adhesive from spreading into the space between the lead frames. The dam can be a dry film, for example, a PSR800 AUS410 dry film.

In another aspect, an apparatus includes a lead frame, a dam and adhesive on portions of the lead frame, and an integrated circuit die having a portion on the dam and another portion on the adhesive. In this aspect, the dam is smaller than the integrated circuit die in a width and length dimension of the dam relative to the integrated circuit die, over at least a portion of the dam and the integrated circuit die, where the integrated circuit die overhangs the dam in each location where the dam is smaller than the integrated circuit die in the width or the length dimension. The dam and the integrated circuit die bridge a space adjacent to a side of the lead frame. Adhesive is located between the integrated circuit die and the lead frame, adjacent to and on each side of the dam, due to the dam being smaller than the integrated circuit die in the width and the length dimension. The dam prevents adhesive from spreading into the space adjacent to the side of the lead frame.

In a further aspect, a method of manufacturing an integrated circuit package includes the steps of placing an integrated circuit die on a dam, the dam being smaller than the integrated circuit die in at least a width dimension of the dam relative to a width dimension of the integrated circuit die, where the integrated circuit die overhangs the dam on each side of the width dimension of the dam. The integrated circuit die and the dam are placed on a two portion lead frame, where the dam and the integrated circuit die bridge a space between the two portions of the lead frame. Adhesive is located between the integrated circuit die and the lead frame, adjacent to and on each side of the dam, due to the dam being smaller than the integrated circuit die in at least the width dimension. The dam prevents the adhesive from spreading into the space between the two portions of the lead frame. The dam can be attached to the integrated circuit die prior to the placing of the integrated circuit die and the dam on the two portions of lead frame. In this aspect, manufacturing the integrated circuit package could include connecting bond pads of the integrated circuit die to bond finger connections of the integrated circuit package, and encapsulating the integrated circuit die in the integrated circuit package.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different parties may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . "

Figure 1:
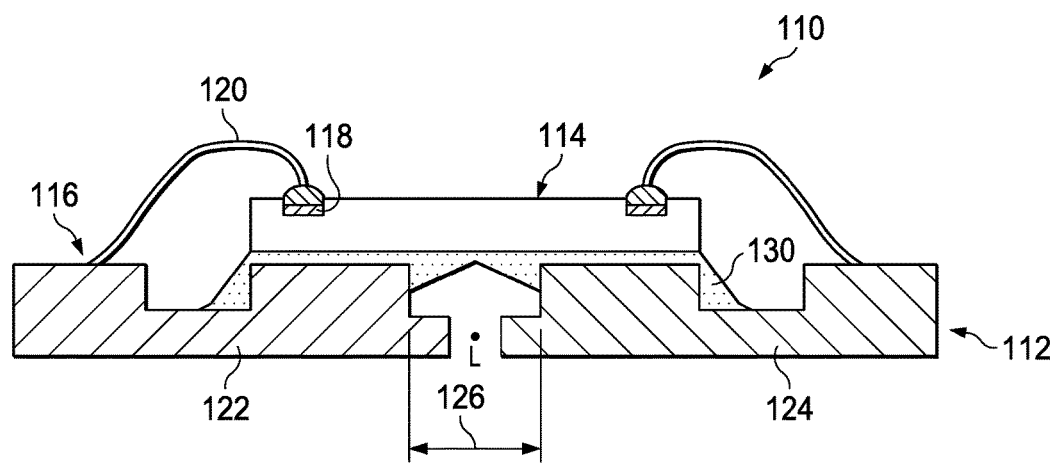
FIG. 1 illustrates a cross-section view of a semiconductor integrated circuit package.

FIG. 1 illustrates a cross-section view of a semiconductor integrated circuit package 110 having a lead frame 112, an integrated circuit die (or silicon semiconductor chip or laminate) 114, a plurality of bond fingers 116, a plurality of bond pads 118, and bond wires 120.

The bond fingers 116 generally extend about a perimeter of a side surface of the die 114 attached to the lead frame 112. The bond fingers 116 are electrically connected to the bond pads 118 on a surface of the die 114 by respective bond wires 120.

The lead frame 112 can include two portions or sides 122, 124, or two lead frames 122, 124 (e.g., a high voltage (HV) side 122 and a low voltage (LV) side 124). In the cross-section view of FIG. 1, a space exists between the two portions, or between the HV side 122 and the LV side 124. This space is referred to as a pad-to-pad (P2P) space 126. The P2P space 126 runs longitudinally, along a longitudinal axis L of the integrated circuit package 110, between internal edges (pads) of the two portions 122, 124 (e.g., between the HV side 122 and the LV side 124). In FIG. 1, longitudinal axis L runs into and out of the page, as shown.

The integrated circuit die 114 is attached to the lead frame 112 by an adhesive resin 130. As shown in FIG. 1, the adhesive resin 130 has a tendency to bleed or spread into the space between the HV side 122 and the LV side 124 (or the two portions) of the lead frame 112. Excessive resin 130 in this space can cause bridging and/or arcing. Note the bridging shown in FIG. 1.

Figure 2:
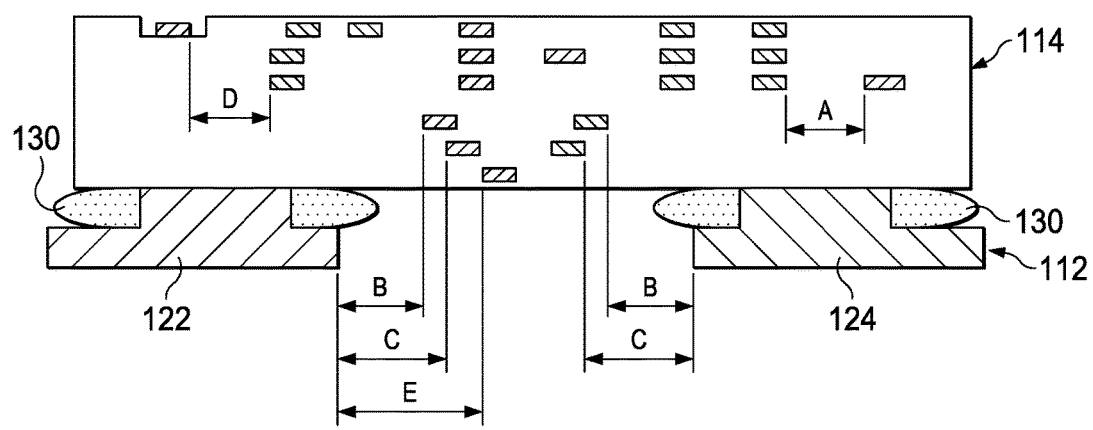
FIG. 2 illustrates a cross-section view of another semiconductor integrated circuit.

As shown in FIG. 2, the adhesive resin (e.g., conductive die attach D/A) 130 can spread or bleed into the P2P space 126 after die 114 attachment to the lead frame 112 and shorten the P2P space (or split) 126 between the HV side 122 and the LV side 124, encroaching upon and effecting proper clearances of M4/5/6 trace-DAP spacing (e.g., B, C, E) shown in FIG. 2. The adhesive resin (e.g., conductive die attach D/A) 130 sometimes prefers contact with the die 114, instead of the lead frame 112, due to good wetting ability between the adhesive resin 130 and a solder resist of the die 114.

Figure 3:
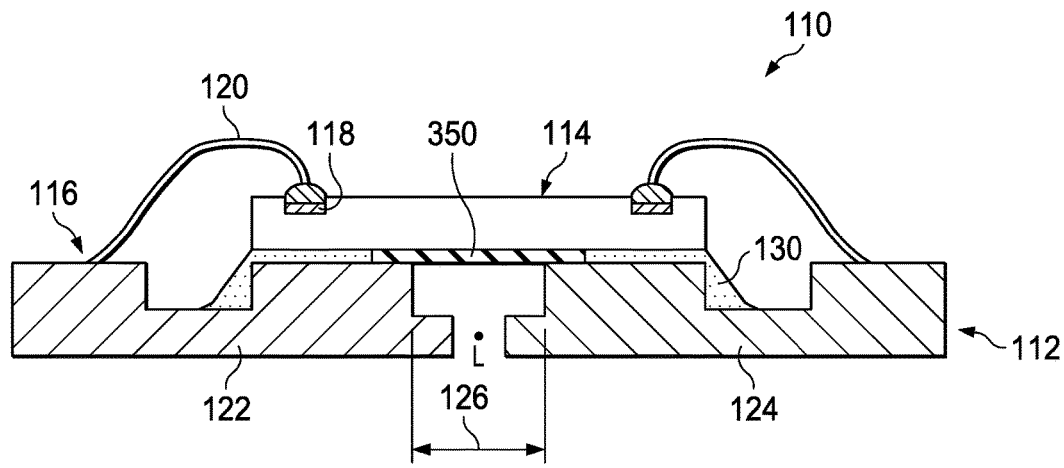
FIG. 3 illustrates a cross-section view of one aspect of a semiconductor integrated circuit package in accordance with various examples.

FIG. 3 illustrates a cross-section view of a semiconductor integrated circuit package 110, such as that shown in FIG. 1, with a solder resist (S/R) dam 350 located between the integrated circuit die 114 and the lead frame 112. The addition of the S/R dam 350, between the die 114 and the lead frame 112, provides control of the location of the adhesive resin 130 to ensure isolation design parameters.

As shown in FIG. 3, the S/R dam 350 bridges the space 126 between the two portions of the lead frame 112 (e.g., the dam spans from the HV side 122 to the LV side 124 of the lead frame 112), while residing on the HV side 122 and the LV side 124 of the lead frame 112. In one aspect, the S/R dam 350 can be a dry film. In another aspect, the S/R dam 350 is PSR800 AUS410 dry film. The S/R dam 350 could generally be between 25 and 30 microns in thickness (e.g., in vertical height as shown in FIG. 3). In a further aspect, the S/R dam 350 can first be attached to the integrated circuit die 114, then the die 114 with the dam 350, together, are attached to the lead frame 112. In any event, or in any method of fabrication, the S/R dam 350 is located between the integrated circuit die 114 and the lead frame 112.

In one aspect, the dam 350 lies within the inside of the die 114 area. In another aspect, the dam 350 is smaller than the integrated circuit die 114 in at least a width dimension of the dam 350 and of the integrated circuit die 114. In a further aspect, the integrated circuit die 114 overhangs the dam on each side of the width dimension of the dam 350 and of the integrated circuit die 114, when the dam 350 is attached to, or is arranged relative to, the die 114. As shown in FIG. 3, this arrangement creates a gap between the die 114 and each of the two portions of the lead frame 112 (e.g., each of the HV side 122 and the LV side 124 of the lead frame 112), on each side of the S/R dam 350. The gap is filled by adhesive resin 130. The S/R dam 350 limits the location of the adhesive resin 130 when the die 114 is attached to the lead frame 112. In this way, the dimension of the dam 350 relative to the die 114 (and the resulting dimension of the overhang) controls the location of the die adhesive to desired parameters. This better ensures isolation design parameters of the semiconductor, thereby providing higher efficiency and isolated power by improving space utilization. In certain instances, use of the S/R dam during semiconductor integrated circuit package fabrication can eliminate the need for die adhesive extrusion inspection during fabrication.

Figure 4:
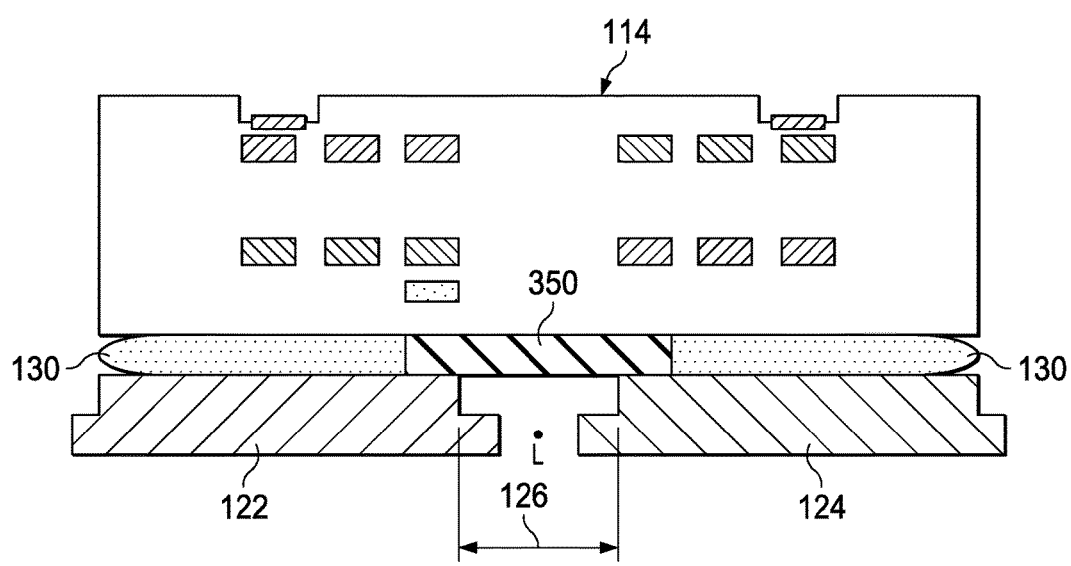
FIG. 4 illustrates a cross-section view of another aspect of a semiconductor integrated circuit package in accordance with various examples.

FIG. 4 illustrates a cross-section view of a semiconductor integrated circuit package 110, with the solder resist (S/R) dam 350 located between the integrated circuit die 114 and the lead frame 112. The addition of the S/R dam 350, between the die 114 and the lead frame 112, where the S/R dam 350 has a width as shown in the FIG. 4 cross-section, provides control of the location of the adhesive resin 130 to ensure desired isolation design parameters.

Figure 5:
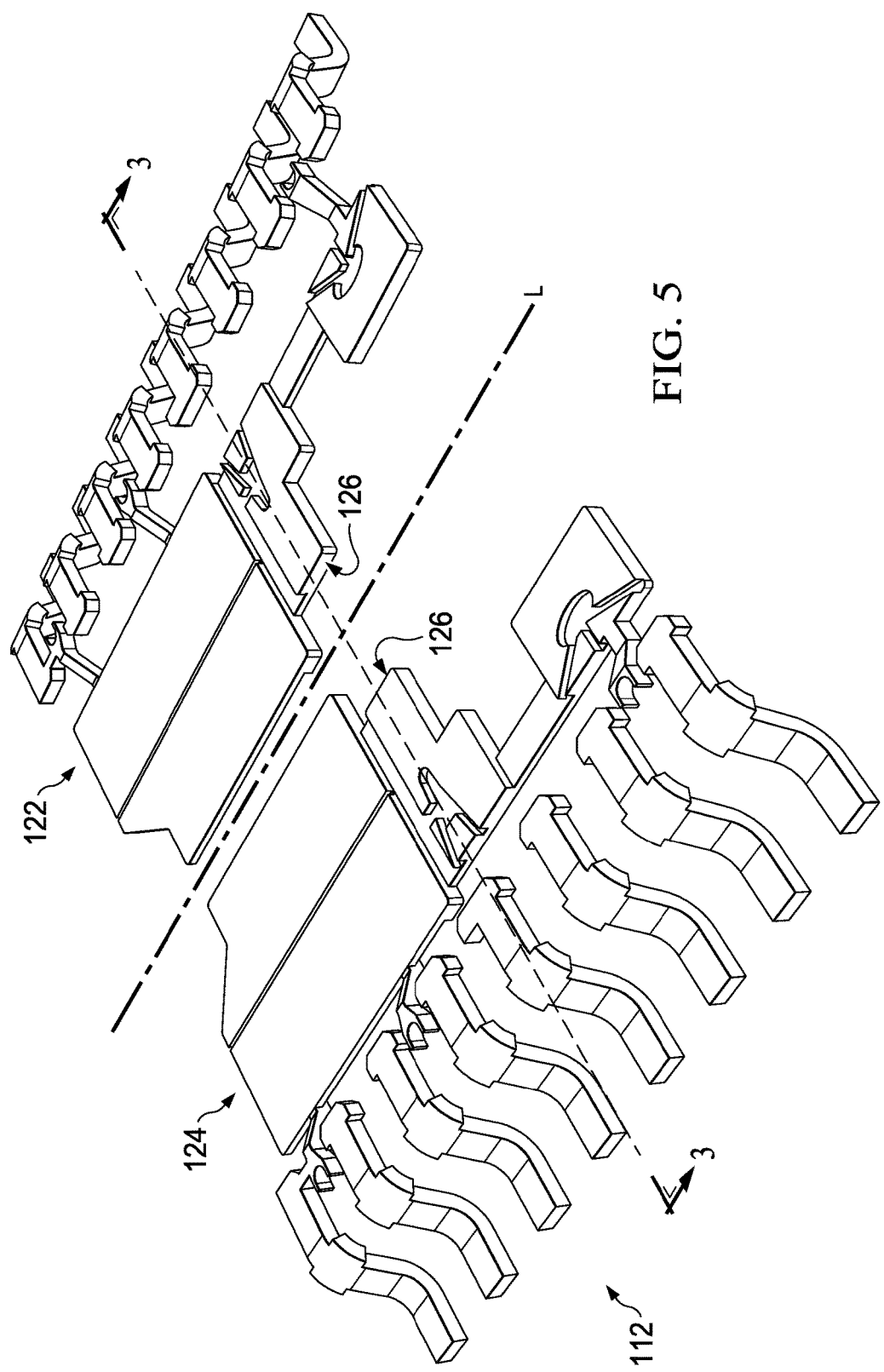
FIG. 5 illustrates a perspective view of one aspect of a lead frame in accordance with various examples.

FIG. 5 illustrates a perspective view of a lead frame 112 including two lead frames 122, 124, or two portions 122, 124 of a lead frame (e.g., a high voltage (HV) side 122 and a low voltage (LV) side 124). FIG. 5 provides a perspective view (relative to the cross-section view of FIG. 3), showing the P2P space 126 between the HV side 122 and the LV side 124. Also shown is the longitudinal axis L of the integrated circuit package 110, between internal edges (pads) of the HV side 122 and the LV side 124. If FIG. 5 illustrated a complete representation of the semiconductor integrated circuit package 110, rather than just the lead frame 112, the integrated circuit package 110 shown in the cross-section of FIG. 3 would be located at line 3-3 of FIG. 5.

Figure 6:
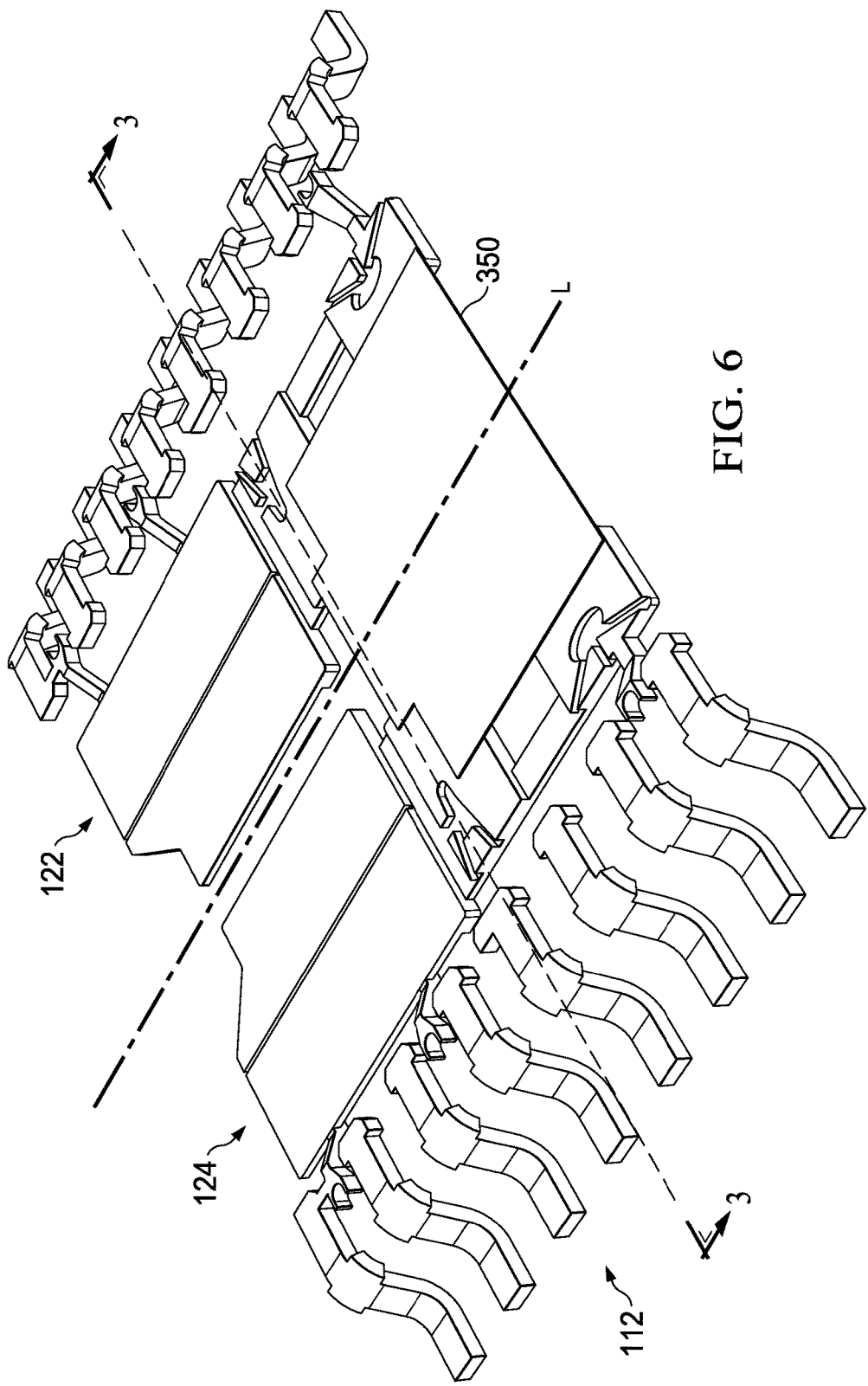
FIG. 6 illustrates a perspective view of one aspect of a lead frame with a S/R dam thereon, in accordance with various examples.

FIG. 6 illustrates a perspective view of the lead frame 112 of FIG. 5, further showing a S/R dam 350 located thereon. In this aspect, the S/R dam 350 is referred to a T-dam, due to a shape of the S/R dam 350 in spanning certain portions of the HV side 122 and the LV side 124 of the lead frame 112. In other aspects, the S/R dam 350 may be I-shaped or may be one of various other shapes. Again, if FIG. 6 illustrated a complete representation of the semiconductor integrated circuit package 110, rather than just the lead frame 112 and the S/R dam 350, the integrated circuit package 110 shown in the cross-section of FIG. 3 would be located at line 3-3 of FIG. 6.

Figure 7:
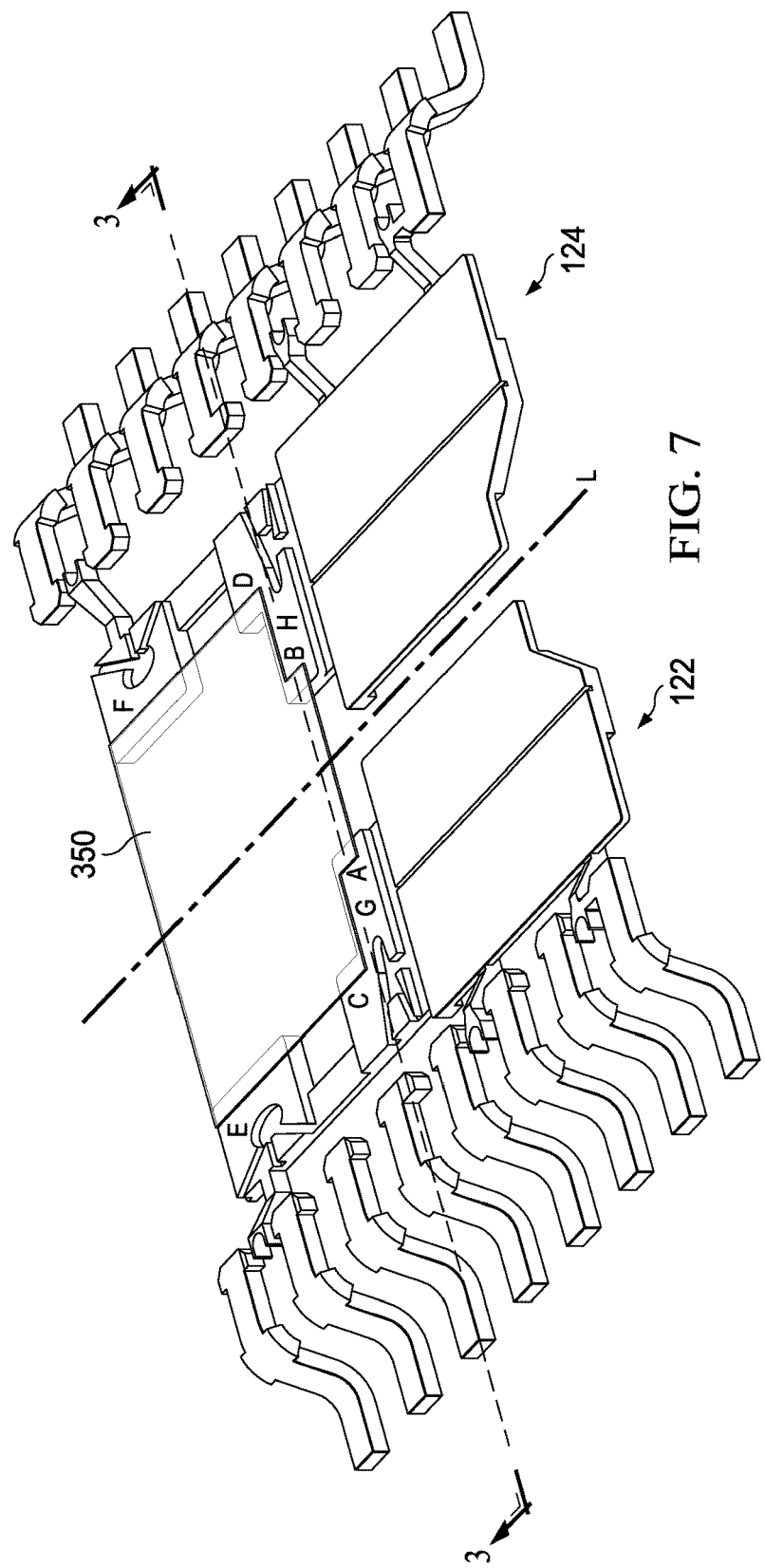
FIG. 7 illustrates a perspective view, from another end, of the aspect of a lead frame with a S/R dam thereon shown in FIG. 6.

FIG. 7 illustrates, from an opposite end, a perspective view of the lead frame 112 of FIG. 6. FIG. 7 again shows the S/R dam 350 on the lead frame 112 (i.e., the S/R dam 350 only, without a die thereon). FIG. 7 illustrates the S/R dam 350 in transparent fashion, allowing see-through to illustrate example spanning (and overlap) of various portions of the HV side 122 and the LV side 124 of the lead frame 112 by the S/R dam 350. Note that in the FIG. 7 example, the S/R dam 350 not only spans (overlaps) the HV side 122 and the LV side 124 across a width of the P2P space 126 (i.e., perpendicular to the longitudinal axis L), at locations A and B, but the S/R dam 350 spans (overlaps) the HV side 122 and the LV side 124 (i.e., perpendicular to the longitudinal axis L) across various widths of the space between the HV side 122 and the LV side 124 at various locations along the longitudinal axis L (for example, at locations C and D; and E and F). In addition, the S/R dam 350 spans (overlaps) each of the HV side 122 and the LV side 124 in certain locations in a direction parallel to the longitudinal axis L (for example, at location G and H). Again, if FIG. 7 illustrated a complete representation of the semiconductor integrated circuit package 110, rather than just the lead frame 112 and the S/R dam 350, the integrated circuit package 110 shown in the cross-section of FIG. 3 would be located at line 3-3 of FIG. 7. The perspective end viewed in FIG. 7 is consistent with the side shown in the cross-section view of FIG. 3.

Figure 8:
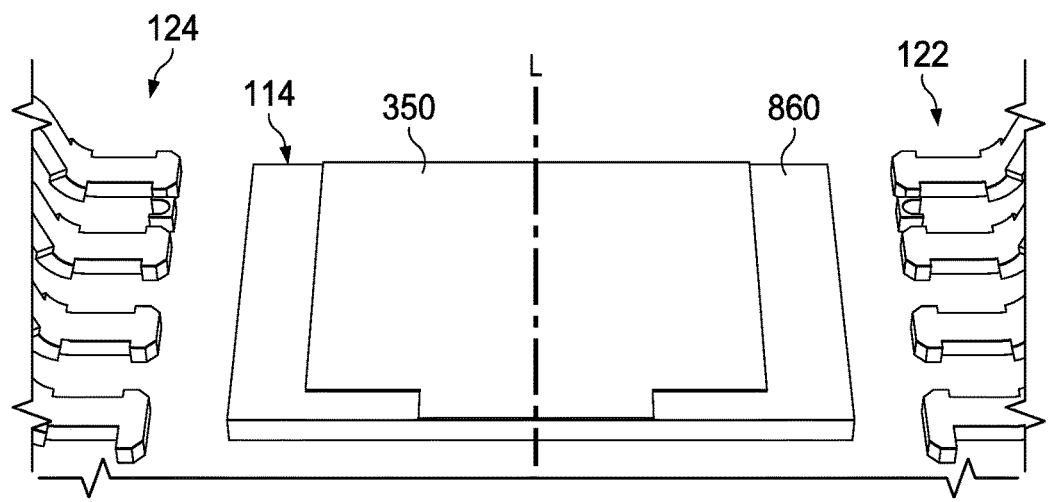
FIG. 8 illustrates a perspective view, from an underside, of one aspect of an integrated circuit die, relative to a S/R dam thereon, with portions of a lead frame thereabout, in accordance with various examples.

FIG. 8 illustrates, from an underside perspective view, the S/R dam 350 relative to, and within an area of, the die 114, along with partial portions of the lead frame 112, showing partial portions of the HV side 122 and the LV side 124. FIG. 8 highlights how the S/R dam 350, lying within an area of the die 114, creates an overhang 860 of the die 114 on each side of a width dimension of the dam 350 (i.e., perpendicular to the longitudinal axis L), when the S/R dam 350 is attached to, or is arranged relative to, the die 114. FIG. 8 also shows how the S/R dam 350, lying within an area of the die 114, creates an overhang 860 of the die 114 along a length dimension of the dam 350 (i.e., parallel to the longitudinal axis L), when the S/R dam 350 is attached to, or is arranged relative to, the die 114. FIG. 8 illustrates an example T-shaped S/R dam 350. Other S/R dam 350 and overhang 860 configurations are possible (e.g., an I-shaped S/R dam 350).

Figure 9:
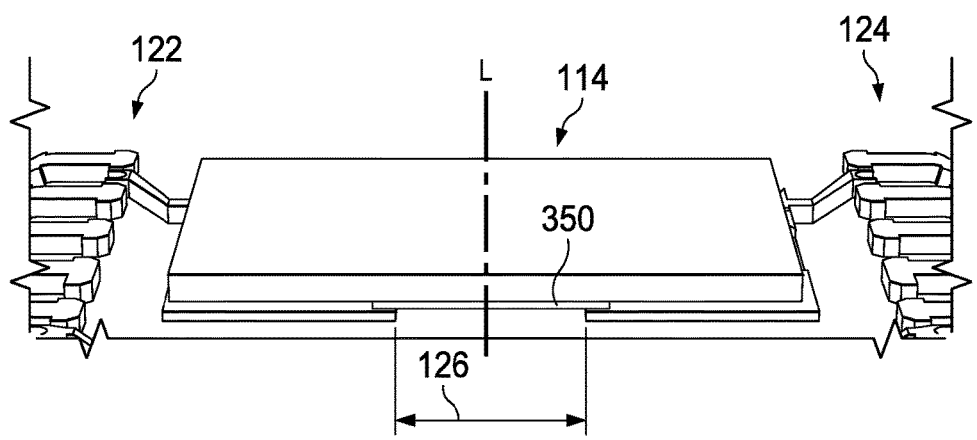
FIG. 9 illustrates a perspective view of one aspect of an integrated circuit die above a S/R dam, all relative to portions of a lead frame, in accordance with various examples.

FIG. 9 illustrates a perspective view (but closer to an elevation view) of an example (and partial) semiconductor integrated circuit package 110, showing the die 114 on the S/R dam 350, with the S/R dam 350 on and overlapping the HV side 122 and the LV side 124 of the lead frame 112. The S/R dam 350, spanning across the HV side 122 and the LV side 124 of the lead frame 112 prevents the adhesive resin, located beneath the overhang 860 (or in the gap between the die 114 and a respective HV side 122 and/or LV side 124 of the lead frame 112), from bleeding into the P2P spacing 126 between the HV side 122 and the LV side 124.

The above discussion is meant to be illustrative of the principles and various examples of the disclosure. Numerous variations and modifications will become apparent to those skilled in the art once the above disclosure is fully appreciated. It is intended that the following claims be interpreted to embrace all such variations and modifications.

What is claimed is:

1. An apparatus, comprising:
   a lead frame;
   a dam and adhesive on portions of the lead frame; and
   an integrated circuit die having a portion on the dam and another portion on the adhesive, wherein the lead frame includes two lead frames.

2. The apparatus of claim 1, wherein the dam bridges a space between the two lead frames.

3. The apparatus of claim 2, wherein the dam is smaller than the integrated circuit die in at least a width dimension of the dam relative to a width dimension of the integrated circuit die, wherein the integrated circuit die overhangs the dam on each side of the width dimension of the dam.

4. The apparatus of claim 1, wherein the dam is smaller than the integrated circuit die in at least a width dimension of the dam relative to a width dimension of the integrated circuit die, wherein the integrated circuit die overhangs the dam on each side of the width dimension of the dam.

5. The apparatus of claim 1, wherein adhesive is located between the integrated circuit die and the lead frame, adjacent to and on each side of the dam.

6. The apparatus of claim 1, wherein the dam is a dry film.

7. The apparatus of claim 1, wherein the dam is smaller than the integrated circuit die in a length dimension of the dam relative to a length dimension of the integrated circuit die, over at least a portion of the dam and of the integrated circuit die, wherein the integrated circuit die overhangs the dam over at least the portion of the dam and of the integrated circuit die.

8. The apparatus of claim 7, wherein adhesive is located between the integrated circuit die and the lead frame, adjacent to and on a side of the dam, due to the dam being smaller than the integrated circuit die in the length dimension of the dam relative to the length dimension of the integrated circuit die over at least the portion of the dam and of the integrated circuit die.

9. The apparatus of claim 2, wherein the dam is smaller than the integrated circuit die in a length dimension of the dam relative to a length dimension of the integrated circuit die, over at least a portion of the dam and of the integrated circuit die, wherein the integrated circuit die overhangs the dam over at least the portion of the dam and of the integrated circuit die.

10. The apparatus of claim 9, wherein adhesive is located between the integrated circuit die and the lead frame, adjacent to and on a side of the dam, due to the dam being smaller than the integrated circuit die in the length dimension of the dam relative to the length dimension of the integrated circuit die over at least the portion of the dam and of the integrated circuit die.

11. An apparatus, comprising:
    a lead frame including two die attach pads, each of the two die attach pads electrically connected to at least one lead of a plurality of leads;
    a dam and adhesive on portions of the lead frame; and
    an integrated circuit die having a portion on the dam and another portion on the adhesive; wherein:
    the dam is smaller than the integrated circuit die in a width and length dimension of the dam relative to the integrated circuit die, over at least a portion of the dam and the integrated circuit die, wherein the integrated circuit die overhangs the dam in each location where the dam is smaller than the integrated circuit die in the width or the length dimension;
    the dam and the integrated circuit die bridge a space adjacent to a side of the lead frame;
    adhesive is located between the integrated circuit die and the lead frame, adjacent to and on each side of the dam, due to the dam being smaller than the integrated circuit die in the width and the length dimension, whereby the dam prevents adhesive from spreading into the space adjacent to the side of the lead frame.

12. An apparatus, comprising:
    two die attach pads, each of the two die attach pads electrically connected to at least one lead of a plurality of leads;
    a dam and an adhesive on portions of the two die attach pads; and
    an integrated circuit die having a portion on the dam and another portion on the adhesive.

13. The apparatus of claim 12, wherein the dam bridges a gap between the two die attach pads.

14. The apparatus of claim 12, wherein the integrated circuit die is electrically connected to at least one of the plurality of leads.

15. The apparatus of claim 12, wherein the dam is smaller than the integrated circuit die in at least a width dimension of the dam relative to a width dimension of the integrated circuit die, wherein the integrated circuit die overhangs the dam on each side of the width dimension of the dam.

16. The apparatus of claim 12, wherein the dam is a dry film.

17. The apparatus of claim 12, wherein a plane along a surface of the adhesive is coplanar with a plane along a surface of the dam.

18. The apparatus of claim 12, wherein one die attach pad of the two die attach pads is at a low voltage side of the apparatus and the other die attach pad of the two die attach pads is at a high voltage side of the apparatus.

\* \* \* \* \*